United States Patent
Jeong et al.

(10) Patent No.: US 8,354,281 B2
(45) Date of Patent: Jan. 15, 2013

(54) METHOD OF MANUFACTURING BACK-SURFACE ELECTRODE TYPE SOLAR CELL

(75) Inventors: Kyoung-Jin Jeong, Gyunggi-do (KR);
Donghoon Kim, Gyunggi-do (KR);
Jaewoo Joung, Gyunggi-do (KR);
Sungil Oh, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 562 days.

(21) Appl. No.: 12/654,527

(22) Filed: Dec. 22, 2009

(65) Prior Publication Data

US 2011/0065229 A1    Mar. 17, 2011

(30) Foreign Application Priority Data

Sep. 16, 2009  (KR) .................. 10-2009-0087726

(51) Int. Cl.
*H01L 21/00* (2006.01)

(52) U.S. Cl. .......................................... 438/19; 136/256
(58) Field of Classification Search .................. 438/19; 136/256
See application file for complete search history.

(56) References Cited

U.S. PATENT DOCUMENTS

2009/0272434 A1*  11/2009  Tachibana ...................... 136/256
2009/0308448 A1*  12/2009  Lu et al. ........................ 136/256

FOREIGN PATENT DOCUMENTS

KR    10-2009-0073308    7/2009

* cited by examiner

*Primary Examiner* — William D Coleman

(57) ABSTRACT

There is provided a method of manufacturing a back-surface electrode type solar cell. The method may include: forming a conductive metal thin film on a crystalline silicon wafer; forming plate-resistant partition walls on a top surface of the conductive metal thin film; forming a metal layer in a space between the plate-resistant partition walls and then removing the plate-resistant partition walls; and removing the conductive metal thin film that is exposed by removing the plate-resistant partition walls so as to expose the crystalline silicon wafer.

16 Claims, 4 Drawing Sheets

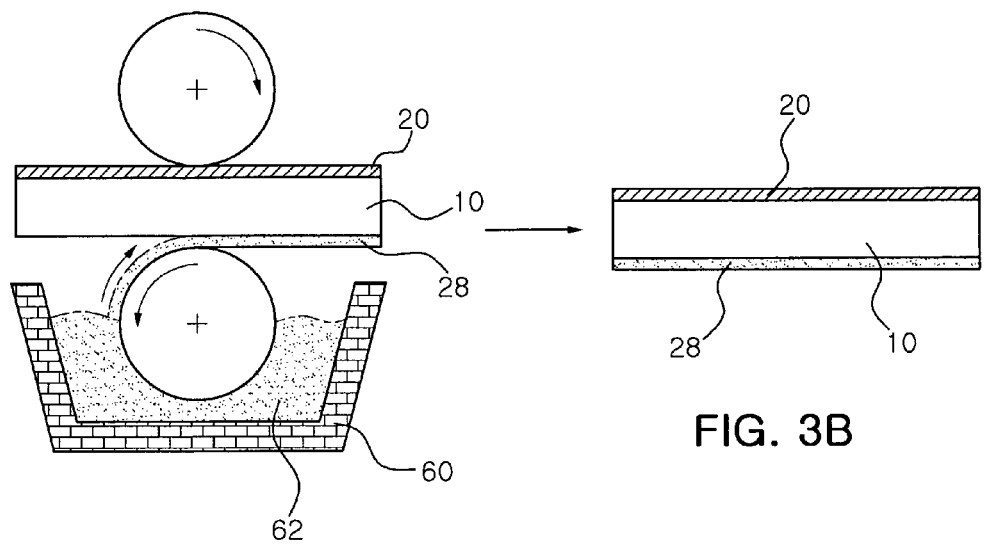
FIG. 3A
FIG. 3B
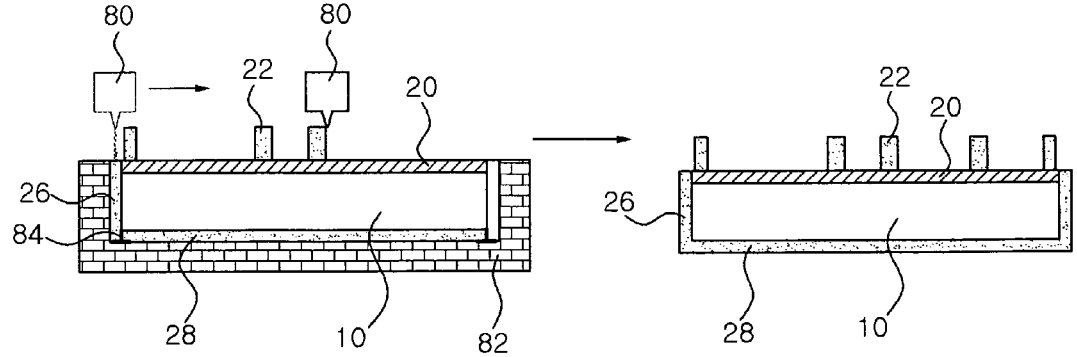
FIG. 3C
FIG. 3D

METHOD OF MANUFACTURING BACK-SURFACE ELECTRODE TYPE SOLAR CELL

CROSS-REFERENCE TO RELATED APPLICATIONS

This application claims the priority of Korean Patent Application No. 10-2009-0087726 filed on Sep. 16, 2009, in the Korean Intellectual Property Office, the disclosure of which is incorporated herein by reference.

BACKGROUND OF THE INVENTION

1. Field of the Invention

The present invention relates to a method of manufacturing a back-surface electrode type solar cell, and more particularly, to a method of manufacturing a back-surface electrode type solar cell in which a back-surface electrode is manufactured on a crystalline silicon substrate by using an ink jet printing method.

2. Description of the Related Art

As a green energy source able to replace depletable chemical energy resources and help reduce global warming, solar energy, along with a fuel cell, has attracted a great deal of attention.

A solar cell is an apparatus that converts light energy into electrical energy by utilizing the characteristics of a semiconductor.

Such a solar cell has a pn junction structure acquired by bonding a p-type semiconductor and an n-type semiconductor. When sunlight having energy that is higher than a gap of the energy bands of the semiconductor is incident on the solar cell having such a configuration, holes and electrons are generated within the semiconductor by the energy of the incident solar light. At this moment, in accordance with an electric field generated in the pn junction, holes (+) move to the p-type semiconductor side, and electrons (−) move to the n-type semiconductor side, whereby an electric potential is generated so as to generate a photoelectromotive force. At this time, when a load is connected between electrodes located at both ends of the pn junction, electric current flows, whereby power is generated.

Crystalline silicon solar cells that are manufactured by using a single crystalline silicon wafer and a polycrystalline silicon wafer are widely used as commercial solar cells. These crystalline silicon solar cells are manufactured by performing a process of forming a metal electrode by texturing surface processing, pn junction formation, reflection preventing film formation, and a screen printing method.

FIG. 1 is a schematic perspective view of a general back-surface electrode type solar cell according to conventional technology.

The back-surface electrode type solar cell has a front surface 12 of a crystalline silicon wafer 10 for which a texturing surface process has been performed and has a back surface electrode 40 on a back surface 14.

The back-surface electrode type solar cell having such a structure can decrease the loss occurring due to the shadow of the front surface, compared to a solar cell having electrodes formed on both sides thereof. In addition, since a back-surface junction and electrodes are separately manufactured, there is an advantage in that an additional process is unnecessary.

In addition, light absorption is increased by forming an uneven surface and performing reflection preventing film processing, and a recombination loss decreases by performing low-density doping for the front surface and a passivation process for the front and back surfaces, whereby the efficiency of the cell can be improved.

In order to develop the solar cell having such a structure, a new diffusion process technology for forming a junction on the back surface and technology for forming a back-surface electrode are needed. Since all the electrodes are positioned on the back surface, assembly of modules can be performed in an efficient manner. In addition, damage to the cell can be minimized by developing module design technology, a mass production process, and the like, whereby costs can be reduced.

For acquiring the above-described advantages, the development of a manufacturing process that is simplified and can reduce manufacturing costs is required.

SUMMARY OF THE INVENTION

An aspect of the present invention provides a method of manufacturing a back-surface electrode type solar cell in which a back-surface electrode is manufactured on a crystalline silicon substrate by applying an ink jet printing method.

According to an aspect of the present invention, there is provided a method of manufacturing a back-surface electrode type solar cell. The method includes: forming a conductive metal thin film on a crystalline silicon wafer; forming plate-resistant partition walls on a top surface of the conductive metal thin film; forming a metal layer in a space between the plate-resistant partition walls and then removing the plate-resistant partition walls; and removing the conductive metal thin film that is exposed by removing the plate-resistant partition walls so as to expose the crystalline silicon wafer.

The above-described method may further include forming a plate-resistant ink layer on all surfaces of the crystalline silicon wafer other than the top surface.

After a bottom surface of the crystalline silicon wafer is coated with plate-resistant ink by using a roller, the plate-resistant ink layer may be formed on a side surface by using a jetting method.

The jetting method may be performed inside a housing plate in which the side face of the crystalline silicon wafer having the plate-resistant ink layer formed on the bottom surface thereof and a space in which ink flows are formed.

A plate-resistant ink layer may be formed on all the surfaces of the crystalline silicon wafer other than the top surface by immersing the crystalline silicon wafer in an ink housing plate in which ink is stored.

A light-transmissive water-repellent layer may be formed by using a fluorine series material before the forming of the conductive metal thin film on the crystalline silicon wafer.

The light-transmissive water-repellent layer may be formed by spray coating, brushing, dipping, evaporation coating, a dropping method, sputtering, spin coating, industrial inkjet printing, or roll-to-roll printing.

The conductive metal thin film may be formed of Ag, Cu, Ni, Au, Al, Ti/W, or an alloy thereof.

The conductive metal thin film may be formed by spray coating, brushing, dipping, evaporation coating, a dropping method, sputtering, spin coating, industrial inkjet printing, or roll to roll printing.

A post treatment process of a thermal curing method, a UV curing method, a plasma treatment or a microwave treatment may be performed on the conductive metal thin film after the forming of the conductive metal thin film.

The plate-resistant partition walls may be formed by spray coating, brushing, dipping, evaporation coating, a dropping method, sputtering, spin coating, industrial inkjet printing, roll to roll printing, or plating.

After the forming of the plate-resistant partition walls, a post treatment process of a thermal curing method, a UV curing method, a plasma treatment, or a microwave treatment may be performed.

The metal layer may be formed of Ag, Cu, Ni, Au, Sn, or an alloy thereof.

The metal layer may be formed by spray coating, brushing, dipping, evaporation coating, a dropping method, sputtering, spin coating, industrial inkjet printing, roll to roll printing, or plating.

The plate-resistant partition walls and the plate-resistant ink layer may be removed by etching or stripping.

The conductive metal thin film that is exposed by the removing of the plate-resistant partition walls may be removed by etching or stripping.

BRIEF DESCRIPTION OF THE DRAWINGS

The above and other aspects, features and other advantages of the present invention will be more clearly understood from the following detailed description taken in conjunction with the accompanying drawings, in which:

FIGS. 3A to 3D are schematic cross-sectional diagrams illustrating the appearance of forming a plate-resistant ink layer and partition walls in a crystalline silicon wafer according to an embodiment of the present invention.

DETAILED DESCRIPTION OF THE PREFERRED EMBODIMENT

Figure 1:
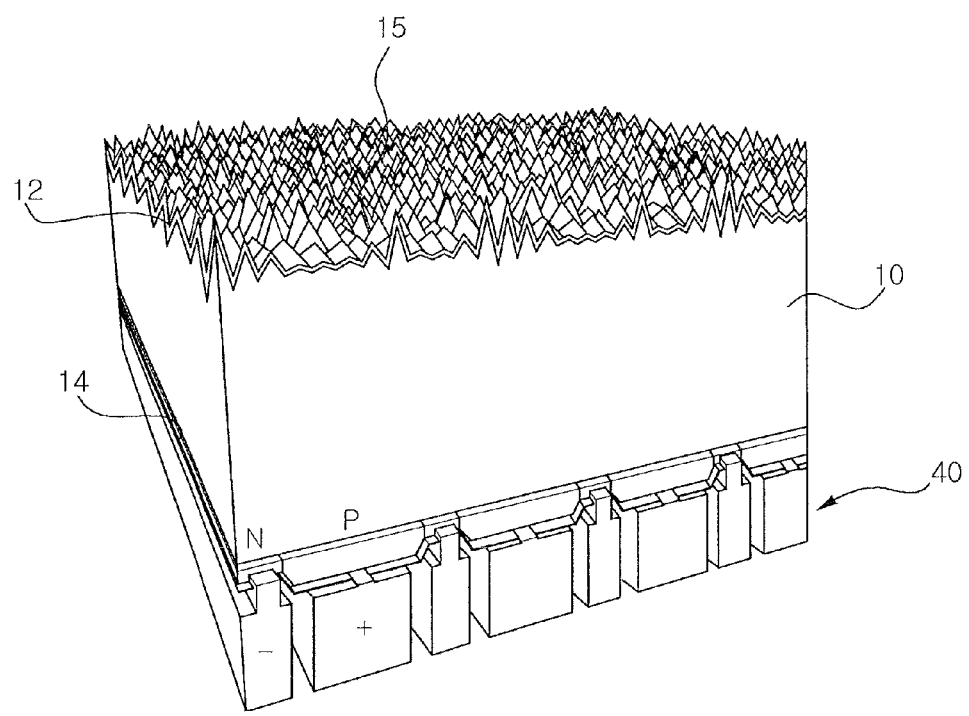
FIG. 1 is a schematic diagram of a general back-surface electrode type solar cell according to conventional technology.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIGS. 2A to 2F are schematic cross-sectional views illustrating the operations of a method of manufacturing a back-surface electrode type solar cell according to an embodiment of the present invention.

By referring to FIGS. 2A to 2F, the method of manufacturing a back-surface electrode type solar cell according to an embodiment of the present invention may be understood.

In particular, this embodiment of the present invention proposes a step for forming a back surface electrode 40 that forms a metal pattern on a crystalline silicon wafer 10.

Figure 2A:
FIGS. 2A to 2F are schematic cross-sectional views illustrating the operations of a method of manufacturing a back-surface electrode type solar cell according to an embodiment of the present invention.
Figure 2B:
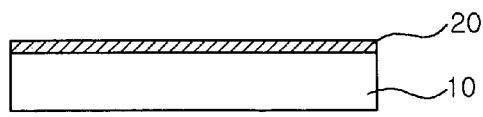

As illustrated in FIGS. 2A and 2B, a conductive metal thin film 20 is formed on the crystalline silicon wafer 10.

By forming a light-transmissive water-repellent layer from a material of fluorine series before forming the conductive metal thin film 20 on the crystalline silicon wafer 10, light transmittance can be increased, and specific resistance can be decreased.

The light-transmissive water-repellent layer increases the absorptivity of incident light, and accordingly, overall light transmittance can be increased.

The light-transmissive water-repellent layer may be formed by spray coating, brushing, dipping, evaporation coating, a dropping method, sputtering, spin coating, industrial inkjet printing, or roll-to-roll printing.

On the other hand, the conductive metal thin film 20 may be formed from Ag, Cu, Ni, Au, Al, Ti/W, or an alloy thereof. The above-described conductive metal film 20 also may be formed by spray coating, brushing, dipping, evaporation coating, a dropping method, sputtering, spin coating, industrial inkjet printing, or roll to roll printing.

After the conductive metal thin film 20 is formed, a post treatment process of a thermal curing method, a UV curing method, a plasma treatment or a microwave treatment is performed, so that the conductive metal thin film 20 is dried and has a dense organization.

Figure 2C:
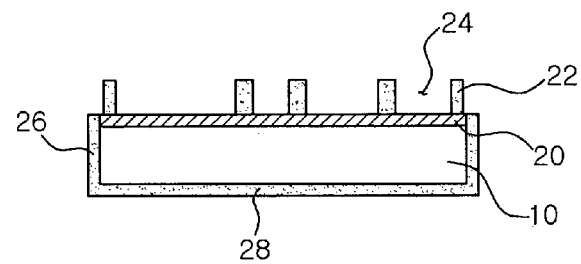

Thereafter, as illustrated in FIG. 2C, on the top face of the conductive metal thin film 20, plate-resistant partition walls 22 are formed.

The plate-resistant partition walls 22 may be formed by spray coating, brushing, dipping, evaporation coating, a dropping method, sputtering, spin coating, industrial inkjet printing, roll to roll printing, or plating.

After the plate-resistant partition walls 22 are formed, a post treatment process of a thermal curing method, a UV curing method, a plasma treatment, or a microwave treatment is performed, whereby the plate-resistant partition walls 22 are dried and have a dense organization.

Here, the "plate-resistant" property represents an acid-resistant property or an alkali-resistant property.

Figure 2D:
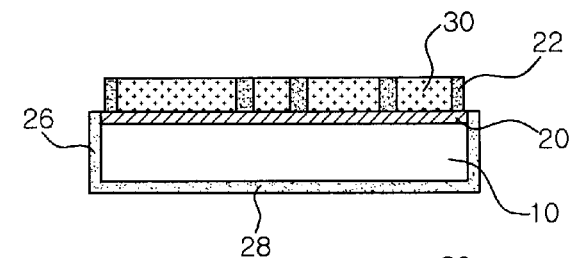
Figure 2E:
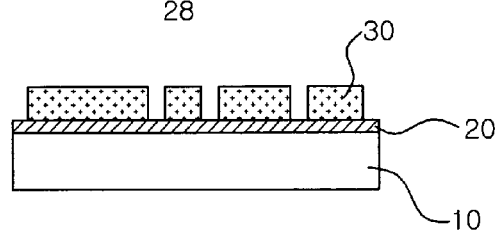

Thereafter, as illustrated in FIGS. 2D and 2E, a metal layer 30 that becomes electrodes is formed in spaces 24 between the plate-resistant partition walls 22. Then, the plate-resistant partition walls 22 are removed, so that the metal layer 30 forms a metallic pattern.

The metal layer 30 is formed from Ag, Cu, Ni, Au, Sn, or an alloy thereof. The metal layer 30 also may be formed by Spray Coating, Brushing, Dipping, Evaporation Coating, a dropping method, sputtering, spin coating, industrial inkjet printing, roll to roll printing, or plating.

Before the metal layer 30 is formed, in order to protect the crystalline silicon wafer 10 by using a plate-resistant material, plate-resistant ink layers 26 and 28 can be formed on the entire surface of the crystalline silicon wafer 10.

Such formation of the plate-resistant ink layers 26 and 28 will be described later in detail.

Figure 2F:
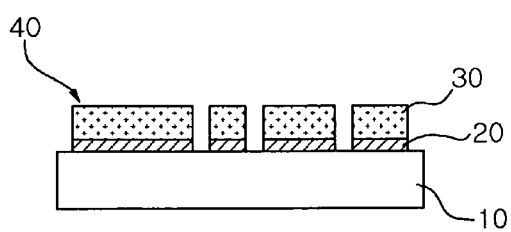

Then, as illustrated in FIG. 2F, in order to form electrodes, the conductive metal thin film 20 that is exposed by removing the plate-resistant partition walls 22 is removed, so that the crystalline silicon wafer 10 is exposed.

By increasing the exposed area of the crystalline silicon wafer 10, an area able to receive light can be expanded to the entire surface other than the electrodes.

The plate-resistant partition walls 22 and the plate-resistant ink layers 26 and 28 can be removed by etching or stripping. In addition, the conductive metal thin film 20 that is exposed by removing the plate-resistant partition walls 22 also can be removed by etching or stripping.

Hereinafter, examples in which the plate-resistant ink layers are formed on the side surface and the bottom surface of the crystalline silicon wafer 10 will be described in details with reference to FIGS. 3A to 3D and FIG. 4.

FIGS. 3A to 3D are schematic cross-sectional diagrams illustrating the appearance of forming a plate-resistant ink layer and partition walls in a crystalline silicon wafer according to an embodiment of the present invention.

First, as illustrated in FIGS. 3A and 3B, a plate-resistant ink layer 28 is formed on the bottom surface of the crystalline silicon wafer 10 by using a roll to roll printing method. While a roll portion 50, which is configured by a dummy roll 52 and an ink coating roll 54, transports the crystalline silicon wafer 10, the bottom surface of the crystalline silicon wafer 10 is coated with ink.

While the ink coating roll 54 rotates while partially immerged in an ink storing basket 62, which stores ink 62 therein, the bottom surface of the crystalline silicon wafer 10 is coated with ink by the ink coating roll 54.

Thereafter, as shown in FIG. 3C, after the crystalline silicon wafer 10 having the plate-resistant ink layer 28 formed on the bottom surface thereof is disposed inside a housing plate 82 of a height extending to the height of the plate-resistant metal 20 and a side portion that forms a space with a side surface of the crystalline silicon wafer 10, ink is printed thereupon so as to form the plate-resistant ink layer 26 and the partition walls 22 on the side surface by using an ink jet printer 80.

Inside the housing plate 82, a position determining portion 84 used for determining the position of the crystalline silicon substrate 10 that has the plate-resistant ink layer 28 formed on the bottom surface thereof is formed. The position determining portion 84 may be formed of a protrusion, a groove, a marking, or the like.

Figures 4A, 4B:
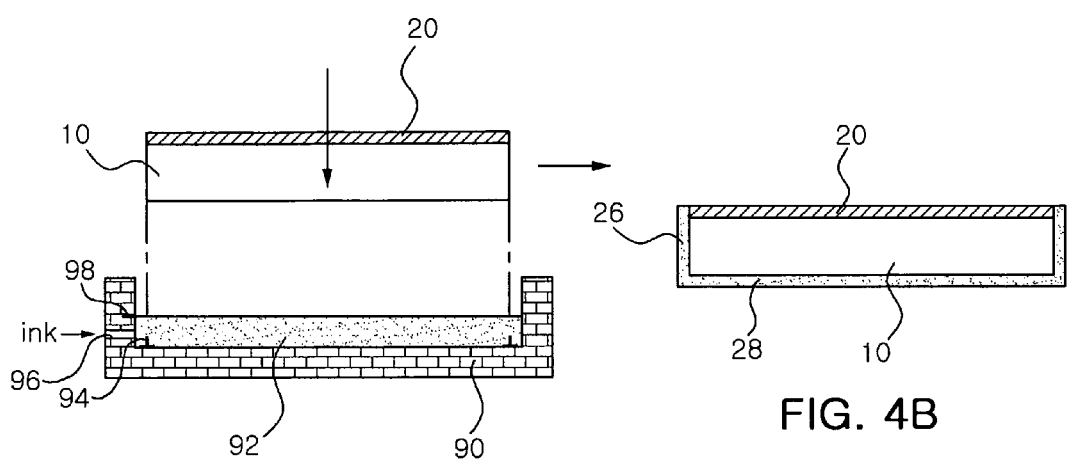
FIGS. 4A to 4C are schematic cross-sectional views illustrating the appearance of forming a plate-resistant ink layer on a crystalline silicon wafer according to another embodiment of the present invention.
Figure 4C:
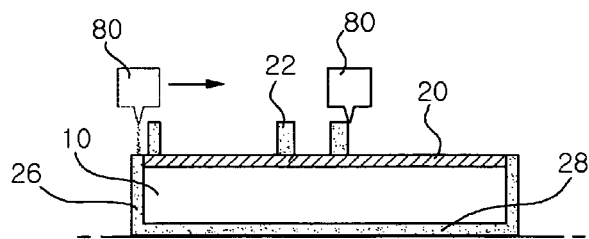

FIGS. 4A to 4C are schematic cross-sectional views illustrating the appearance of forming a plate-resistant ink layer on a crystalline silicon wafer according to another embodiment of the present invention.

According to this embodiment, the crystalline silicon wafer 10 having the conductive metal thin film 20 formed on the top surface thereof is disposed in an ink housing plate 90 that contains a predetermined amount of ink and has a side portion of a height extending up to the height of the plate-resistant metal 20. Then, the plate-resistant ink layers 26 and 28 are simultaneously formed on the side surface and the bottom surface of the crystalline silicon wafer 10.

Inside the ink housing plate 90, a position determining portion 94 used for determining the position of the crystalline silicon substrate 10 that has the plate-resistant ink layer 28 formed on the bottom surface thereof may be formed. The position determining portion 94 may be formed of a protrusion, a groove, a marking, or the like.

In addition, an ink injecting hole 96 through which ink is injected may be formed in the ink housing plate 90. Furthermore, an ink height determining portion 98 that indicates a height, so that the plate-resistant ink layers 26 and 28 can be formed up to the height of the plate-resistant metal 20 in the crystalline silicon substrate 10 may be formed.

In the method of manufacturing a back-surface electrode type solar cell according to an embodiment of the invention, compared to a case where a back surface electrode is formed by exposing a conventional mask by using a screen paste method, there are advantages in that the manufacturing process is simplified, and manufacturing costs are reduced.

In addition, by forming the light-transmissive water-repellent layer, light transmittance can be increased. Accordingly, there are advantages in that the conversion efficiency of the entire solar cell for converting solar light into electrical energy can be increased, and the transmittance for the solar light in all the wavelength bands can be increased.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a back-surface electrode type solar cell, the method:
   forming a conductive metal thin film on a crystalline silicon wafer;
   forming plate-resistant partition walls on a top surface of the conductive metal thin film;
   forming a metal layer in a space between the plate-resistant partition walls and then removing the plate-resistant partition walls; and
   removing the conductive metal thin film that is exposed by removing the plate-resistant partition walls so as to expose the crystalline silicon wafer.

2. The method of claim 1, further comprising: forming a plate-resistant ink layer on all surfaces of the crystalline silicon wafer other than the top surface.

3. The method of claim 1, wherein a light-transmissive water-repellent layer is formed by using a fluorine series material before the forming of the conductive metal thin film on the crystalline silicon wafer.

4. The method of claim 1, wherein the conductive metal thin film is formed of Ag, Cu, Ni, Au, Al, Ti/W, or an alloy thereof.

5. The method of claim 1, wherein the conductive metal thin film is formed by spray coating, brushing, dipping, evaporation coating, a dropping method, sputtering, spin coating, industrial inkjet printing, or roll to roll printing.

6. The method of claim 1, wherein a post treatment process of a thermal curing method, a UV curing method, a plasma treatment or a microwave treatment is performed on the conductive metal thin film after the forming of the conductive metal thin film.

7. The method of claim 1, wherein the plate-resistant partition walls are formed by spray coating, brushing, dipping, evaporation coating, a dropping method, sputtering, spin coating, industrial inkjet printing, roll to roll printing, or plating.

8. The method of claim 1, wherein, after the forming of the plate-resistant partition walls, a post treatment process of a thermal curing method, a UV curing method, a plasma treatment, or a microwave treatment is performed.

9. The method of claim 1, wherein the metal layer is formed of Ag, Cu, Ni, Au, Sn, or an alloy thereof.

10. The method of claim 1, wherein the metal layer is formed by spray coating, brushing, dipping, evaporation coating, a dropping method, sputtering, spin coating, industrial inkjet printing, roll to roll printing, or plating.

11. The method of claim 1, wherein the conductive metal Thin Film that is Exposed by the Removing of the Plate-Resistant Partition Walls is Removed by Etching or Stripping.

12. The method of claim 2, wherein, after a bottom surface of the crystalline silicon wafer is coated with plate-resistant ink by using a roller, the plate-resistant ink layer is formed on a side surface by using a jetting method.

13. The method of claim 2, wherein a plate-resistant ink layer is formed on all the surfaces of the crystalline silicon wafer other than the top surface by immersing the crystalline silicon wafer in an ink housing plate in which ink is stored.

14. The method of claim 2, wherein the plate-resistant partition walls and the plate-resistant ink layer are removed by etching or stripping.

15. The method of claim 12, wherein the jetting method is performed inside a housing plate in which the side face of the crystalline silicon wafer having the plate-resistant ink layer formed on the bottom surface thereof and a space in which ink flows are formed.

16. The method of claim 3, wherein the light-transmissive water-repellent layer is formed by spray coating, brushing, dipping, evaporation coating, a dropping method, sputtering, spin coating, industrial inkjet printing, or roll-to-roll printing.

\* \* \* \* \*

UNITED STATES PATENT AND TRADEMARK OFFICE
CERTIFICATE OF CORRECTION

PATENT NO. : 8,354,281 B2
APPLICATION NO. : 12/654527
DATED : January 15, 2013
INVENTOR(S) : Kyoung-Jin Jeong et al.

It is certified that error appears in the above-identified patent and that said Letters Patent is hereby corrected as shown below:

In the Claims

Column 6, Line 58, 59, In Claim 11, delete "Thin Film that is Exposed by the Removing of the Plate-Resistant Partition Walls is Removed by Etching or Stripping." and insert -- thin film that is exposed by the removing of the plate-resistant partition walls is removed by etching or stripping. --, therefor.

Signed and Sealed this
Eighteenth Day of June, 2013

Teresa Stanek Rea
*Acting Director of the United States Patent and Trademark Office*